United States Patent
Platzgummer et al.

(10) Patent No.: US 8,368,015 B2
(45) Date of Patent: *Feb. 5, 2013

(54) PARTICLE-OPTICAL SYSTEM

(75) Inventors: Elmar Platzgummer, Vienna (AT);
Gerhard Stengl, Wernberg (AT);
Helmut Falkner, Schoenau an der Triesting (AT)

(73) Assignee: Carl Zeiss SMS GmbH, Jena (DE)

(*) Notice: Subject to any disclaimer, the term of this patent is extended or adjusted under 35 U.S.C. 154(b) by 499 days.

This patent is subject to a terminal disclaimer.

(21) Appl. No.: 11/990,067

(22) PCT Filed: Aug. 8, 2006

(86) PCT No.: PCT/EP2006/007849
§ 371 (c)(1),
(2), (4) Date: May 12, 2010

(87) PCT Pub. No.: WO2007/017255
PCT Pub. Date: Feb. 15, 2007

(65) Prior Publication Data
US 2010/0270474 A1 Oct. 28, 2010

(30) Foreign Application Priority Data

Aug. 9, 2005 (EP) ..................... 05017318

(51) Int. Cl.
*G01N 23/00* (2006.01)
*G21K 7/00* (2006.01)
(52) U.S. Cl. ........ 250/306; 250/307; 250/310; 250/398; 250/396 R; 250/396 ML; 250/492.21; 250/492.2
(58) Field of Classification Search .......... 250/306–307, 250/310, 398, 396 R, 396 MI, 492.21, 492.2
See application file for complete search history.

(56) References Cited

U.S. PATENT DOCUMENTS

| | | | |
|---|---|---|---|
| 5,369,282 A | 11/1994 | Arai et al. | |
| 5,399,872 A | 3/1995 | Yasuda et al. | |

(Continued)

FOREIGN PATENT DOCUMENTS

| | | | |
|---|---|---|---|
| JP | 60066816 A | 4/1985 | |
| JP | H09-245708 A | 9/1997 | |

(Continued)

OTHER PUBLICATIONS

Office Action dated Feb. 9, 2012 from parallel Japanese patent application No. 2008-525473, 6 pp. (with English translation, 10 pp.).

*Primary Examiner* — Jack Berman
*Assistant Examiner* — Meenakshi Sahu
(74) *Attorney, Agent, or Firm* — Bruce D Riter

(57) ABSTRACT

The present invention relates to a multi-beamlet multi-column particle-optical system comprising a plurality of columns which are disposed in an array for simultaneously exposing a substrate, each column having an optical axis and comprising: a beamlet generating arrangement comprising at least one multi-aperture plate for generating a pattern of multiple beamlets of charged particles, and an electrostatic lens arrangement comprising at least one electrode element; the at least one electrode element having an aperture defined by an inner peripheral edge facing the optical axis, the aperture having a center and a predetermined shape in a plane orthogonal to the optical axis; wherein in at least one of the plurality of columns, the predetermined shape of the aperture is a non-circular shape with at least one of a protrusion and an indentation from an ideal circle about the center of the aperture.

24 Claims, 6 Drawing Sheets

U.S. PATENT DOCUMENTS

| | | |
|---|---|---|
| 6,965,153 B1 | 11/2005 | Ono et al. |
| 2002/0000766 A1 | 1/2002 | Ono et al. |
| 2002/0039829 A1 | 4/2002 | Yasuda et al. |
| 2003/0155534 A1 | 8/2003 | Platzgummer et al. |
| 2003/0209674 A1* | 11/2003 | Hamaguchi et al. ... 250/396 ML |
| 2005/0072933 A1 | 4/2005 | Stengl et al. |
| 2005/0104013 A1* | 5/2005 | Stengl et al. ............ 250/492.21 |
| 2006/0289804 A1 | 12/2006 | Knippelmeyer et al. |

FOREIGN PATENT DOCUMENTS

| | | |
|---|---|---|
| JP | 2001-284230 A | 10/2001 |
| JP | 2001-345259 A | 12/2001 |
| JP | 2002-110534 A | 4/2002 |
| JP | 2002-217089 A | 8/2002 |
| JP | 2003332204 | 11/2003 |
| JP | 2005-101668 A | 4/2005 |
| JP | 2005-129944 A | 5/2005 |
| JP | 2007-019194 A | 1/2007 |
| WO | WO 01/39243 A1 | 5/2001 |
| WO | 2005-024881 A2 | 3/2005 |

* cited by examiner

PARTICLE-OPTICAL SYSTEM

BACKGROUND OF THE INVENTION

1. Field of the Invention

The invention relates to a multi-beamlet multi-column particle-optical system, in particular a multi-beamlet multi-column particle-optical system comprising a plurality of multi-beamlet particle-optical columns wherein at least one of the multi-beamlet particle-optical columns comprises an electrode element having an aperture of a noncircular shape. The invention further relates to a method of exposing a substrate by multi-beam multi-column exposure using the multi-beamlet multi-column particle-optical system.

2. Brief Description of Related Art

The increasing demand for ever smaller and more complex microstructured devices and the continuing demand for an increase of a throughput in the manufacturing and inspection processes thereof have been an incentive for the development of particle-optical systems that use multiple charged particle beamlets in place of a single charged particle beam, thus significantly improving the throughput of such systems. The use of multiple beamlets is associated with a whole range of new challenges to the design of particle-optical components, arrangements and systems, such as microscopes and lithography systems.

A particle-optical arrangement for forming a plurality of charged-particle beamlets wherein the beamlets are arranged in an array pattern is described in U.S. Pat. Nos. 5,369,282 and 5,399,872, for instance.

Multi-beamlet particle-optical systems make use of a pattern of multiple charged particle beamlets focused on a substrate to be exposed. For example, in an inspection system, a single beam of charged particles is provided by a particle source or, alternatively, multiple beamlets may be provided by an array of charged particle sources. The beam or beamlets is/are then typically directed onto a multi-aperture plate having a plurality of apertures formed therein for generating multiple beamlets from those charged particles of the single beam or beamlets that pass through the apertures of the multi-aperture plate. The multiple beamlets are generally subsequently focused on the substrate, typically by means of a focussing particle-optical lens downstream of the multi-aperture plate. An array of charged particle spots is thus formed on the substrate. Secondary charged particles such as secondary electrons may be emitted by the substrate to be inspected, follow a secondary beamlet path and are incident on a detector.

Further more, in particle-optical lithography, methods of so-called maskless lithography have been established, which, for instance, make use of a blanking aperture array. Such a blanking aperture array typically comprises a multi-aperture plate wherein each of a plurality of apertures is further equipped with a deflecting arrangement, generally comprising electrodes, which, in, a "switched-on" or activated state, is capable of deflecting a beamlet passing through the respective aperture such that it is deflected from a beam path of the beamlets to such an extent that it does not reach the specimen and does not contribute to an exposure of the substrate or specimen. The deflecting arrangements of the individual apertures can thus be switched off or de-activated to let a beamlet pass undisturbed through the respective aperture and a switched-on state where a passing beamlet is deflected away from a beam path and incident on an obstacle in the form of a non-transmitting portion of an aperture or the like such that it will not be incident onto the specimen. By suitable movement of the blanking aperture array relative to the specimen to be exposed and suitable switching sequences of the individual apertures, a pattern can be generated and written onto the specimen, such as described, for instance in US 2003/0155534 A1, the entire content of which is incorporated by reference herein.

In addition to using a plurality of beamlets, systems employing a plurality of two or more particle-optical systems, or columns, operating in parallel to simultaneously expose or inspect the same substrate are being developed. Given that, due to interactions of charged particles, a throughput and a performance of an individual particle-optical system (column) is generally limited by a maximum acceptable current of charged particles in the system, the multi-column approach allows to increase the throughput of such a particle-optical lithography system without further increasing the current through an individual column and therefore avoids a decrease in performance due to space charge effects. Thus, multi-column particle-optical systems comprise a plurality of particle-optical columns which each, in terms of their components and their arrangement, largely correspond to a conventional particle-optical system as described above. An example of a multi-column particle-optical system is described in US Patent Application with publication number US 2005/0104013 A1, the entire content of which is incorporated by reference herein.

Using an array or pattern of beamlets of charged particles requires a multi-beamlet particle-optical system to provide those beamlets in a reliable and accurate manner such that the individual beamlets show little, if any, variation in intensity, deviation from a predetermined position within the array and target position on a substrate, variation in optical properties, such as aberrations and the like. The quality of the pattern of beamlets and, correspondingly, the quality of the pattern of charged particle spots generated in an image or substrate plane, respectively, will generally depend, amongst others, on properties of the beamlet generating arrangement used as well characteristics of the focussing arrangement, such as a lens.

In addition, external factors originating in an environment of the particle-optical system may also influence a performance of the particle-optical system. An example of such an external factor exerting a negative influence on an imaging performance are electromagnetic fields from outside the charged particle system penetrating into the system, as discussed, for instance in US 2005/0072933 A1, the entire content of which is incorporated by reference herein. The electrostatic lens system described therein comprises an electrostatic lens arrangement having more than three electrode elements which are arranged coaxially in series along an optical axis of the electrostatic lens arrangement. Additional shielding is provided by provision of an outer member ring to fill a space between two adjacent electrode elements thus preventing intrusion of interfering electromagnetic fields. The system described therein is a single column system.

In multi-column systems, additional problems arise from the close arrangements of individual columns and their electrostatic and/or electromagnetic fields, which may cause interferences in neighbouring columns. These interferences, for instance a disturbance of a focussing electrostatic and/or electromagnetic field, may cause imaging errors such as particle-optical aberrations and thus deteriorate an imaging performance.

It is therefore an object of the present invention to provide a multi-beamlet multi-column particle-optical system providing an improved imaging performance.

It is a further object of the present invention to provide a multi-beamlet multi-column particle-optical system configured to decrease an influence from one or more neighbouring columns on an imaging performance.

It is another object to provide an improved method of multi-beam multi-column particle-optical exposure.

SUMMARY OF THE INVENTION

As will be described in more detail in the following, the present invention provides a multi-beamlet multi-column particle-optical system comprising a plurality of particle-optical multi-beamlet columns; the plurality of particle-optical multi-beamlet columns being disposed in an array for simultaneously exposing a same substrate; with each particle optical column having an optical axis and comprising: a beamlet generating arrangement comprising at least one multi-aperture plate having a plurality of apertures for generating a pattern of multiple beamlets of charged particles, and an electrostatic lens arrangement downstream of the beamlet generating arrangement, the electrostatic lens arrangement comprising at least one electrode element, the at least one electrode element having an aperture allowing the generated multiple beamlets of charged particles to pass through, the aperture being defined by an inner peripheral edge of the electrode element facing the optical axis, the aperture having a centre and a predetermined shape in a plane orthogonal to the optical axis; wherein in at least one of the plurality of charged particle columns, the predetermined shape of the aperture of the at least one electrode element is a non-circular shape with at least one of a protrusion and an indentation from an ideal circle about the centre of the aperture, and wherein a first distance between a point on the inner peripheral edge of the aperture disposed closest to the centre of the aperture is at least about 5%, preferably at least about 7.5% or more preferably at least about 10% smaller than a second distance between a point on the inner peripheral edge of the aperture disposed furthest away from the centre of the aperture.

The provision of an electrode element having a non-circular aperture allows to correct disturbances of an electrostatic and/or magnetic field within the electrostatic lens arrangement in the column comprising the electrode element having the non-circular aperture. The disturbances or interferences may be caused by neighbouring columns, in particular. The shape of the aperture is adapted to compensate for those disturbances, and optionally also other disturbances, by superimposing additional shape features onto a basic circular shape. The superimposed shape features, in particular indentations and protrusions from an ideal circular shape, allow to generate correcting electrostatic fields, such as multipole electrostatic fields, for instance, in addition to a basic electrostatic field generated by an electrode element having a basic, round shape. Thus, a suitable design of the shape of the aperture of the electrode element allows to correct aberrations caused by an electrostatic/electromagnetic field in a beam path of the charged particle beamlets deviating from an ideal electrostatic/electromagnetic field as a result of disturbances or interferences, such as electrostatic and/or electromagnetic fields of neighbouring columns. Preferably, in terms of disturbances, the interferences generated by an adjacent electrode element, or generally electrostatic field generating arrangement, in the same plane as a given electrode element, as well as interferences generated by an adjacent electrode element disposed in a different plane, for instance upstream or downstream of the given electrode element, are taken into consideration. In other exemplary embodiments, only the interferences resulting from electrode elements, or more generally electrostatic field generating arrangements, in the same plane as the given electrode element my be considered when optimising the non-circular shape of the aperture of the given electrode element.

An indentation, as used herein, is a shape feature that extends from a (virtual) ideal circular shape towards the centre of the shape whereas a protrusion extends from a (virtual) ideal circular shape towards the outside of the ideal circle, i.e. away from its centre. In other words, for purposes of describing a non-circular shape, each shape is associated with an ideal circle having shape features superimposed thereto. Generally, out of a number of possible circles, the ideal circle would be chosen such that it comprises most of the points disposed on the peripheral edge of the shape. It may also be chosen such that the area covered by the shape features is minimal, for instance in cases where a shape may be described as having indentations or may be equally described as having protrusions. In that case the ideal circle can be advantageously chosen such that the (absolute) area covered by the respective shape feature is minimal, and in case that the areas of the indentations or protrusions should be equal, the area of the ideal circle may be chosen to be minimal.

In exemplary embodiments, the first distance is by at least about 5% smaller than the second distance, in further exemplary embodiments by at least about 10%, for instance at least about 15% or 20% smaller. The difference between the first and second distances is indicative of a deviation of the shape of the aperture from the ideal circular shape, or a contribution of additional shape features, which difference enables the provision of a desired field shaping or field correcting effect.

The difference between the first distance and the second distance may be, in an exemplary embodiment, at least 1 μm, or may be at least 5 μm, or more preferably at least 10 μm and in further exemplary embodiments at least 15 μm.

The at least one electrode element may be comprised of only one part or several parts or members.

Inner peripheral edge, as used herein, may be a protruding portion of the electrode element or a member thereof, for instance, or may be a portion of a substantially continuous inner side of the electrode element or a member thereof, or any other suitable configuration.

Preferably, the centre of the aperture is disposed on the optical axis of the multi-beamlet particle-optical column comprising the aperture.

Generally, the centre of the aperture is the point of the aperture having the highest symmetry. The shape of the aperture is generally asymmetric with respect to the centre thereof. In exemplary embodiments, the shape of the aperture of one or more columns may be rotationally asymmetric.

Preferably, the optical axes of the columns of the plurality of columns are arranged in parallel.

Downstream, as used herein, refers to a direction of charged particles in the particle-optical system, starting at the beamlet generating arrangement or, more generally, a charged particle source and ending at the substrate (or specimen) plane.

Exposing the substrate may comprise exposing the substrate to charged particles to write a pattern onto a substrate in a lithographic process or to inspect the substrate by detecting secondary charged particles emitted by the substrate as a result of charge particles impinging onto a surface thereof.

In exemplary embodiments, the aperture of the electrode element may be formed by the inner peripheral edge of an annular inner electrode member. The inner peripheral edge and/or the entire annular inner electrode member (that is an inner side and an outer side of the member) may taper or extend under an angle towards the optical axis. In those embodiments, the noncircular shape of the aperture may extend over the entire axial dimension of the inner electrode member or just an axial portion of the inner electrode member and inner peripheral edge, respectively. The axial portion in those exemplary embodiments may be, for instance, a portion of the inner electrode member disposed closest to the optical axis, i.e. a portion where the area of the aperture formed by the inner peripheral edge of the electrode member is smallest and the inner peripheral edge hence closest to the optical axis. In further exemplary embodiments, the inner electrode member has a substantially conical shape with the inner peripheral edge on the inside of the conus forming a noncircular aperture at least over an axial portion, preferably over an entire axial length of the inner electrode member.

The cross-section of the inner electrode member may have a regular or an irregular shape, for instance in the axial direction. In exemplary embodiments, the inner electrode member may, for instance, be split or forked into two portions each extending towards the optical axis, for instance at two different angles. In other exemplary embodiments, the inner electrode member may be constituted by or at least comprise a protruding portion extending towards the optical axis and having a curved shape, the curved shape, for instance being a regular or irregular concave shape as seen from a direction of beamlets of particles passing through. The inner electrode member and/or a protruding portion thereof may have a constant thickness or a varying thickness.

In preferred embodiments, and in line with the teaching of US 2005/0072933 A1, as mentioned above, in the at least one of the plurality of charged particle multi-beamlet columns, the electrostatic lens arrangement comprises two or more electrode elements which are disposed coaxially and spaced apart, i.e. in series, in the direction of the optical axis. Providing a series of coaxially aligned electrode elements allows improved shielding of a space inside the electrode elements, as mentioned in connection with the disclosure of the above-cited patent application. In exemplary embodiments, three or more than three electrode elements are provided. In further exemplary embodiments, the majority or all of the plurality of multi-beamlet particle-optical columns comprise two or more electrode elements, for instance three or four and more electrode elements. Each electrostatic lens arrangement of the plurality of multi-beamlet particle-optical columns may comprise the same number of electrode elements. Further more, the electrostatic lens arrangements of the plurality of multi-beamlet particle-optical columns may be substantially the same or may be different in terms of configuration, such as a number of electrode elements, a distance of electrode elements from one another, a position of the electrostatic lens arrangement within the column and other parameters, as will be readily apparent to the skilled person.

In those embodiments wherein the electrostatic lens arrangement of the at least one of the plurality of particles comprises two or more electrode elements, the apertures of the at least two electrode elements (of the same, at least one column) preferably have substantially the same non-circular shape. In other embodiments, the at least two electrode elements may have different non-circular shapes. A difference in shapes may relate, for instance, to at least one of a number of indentations, a number of protrusions, a shape of one or more protrusions, a shape of one or more indentations, a size of one or more protrusions, a size of one or more indentations, a symmetry of the shape and any combination thereof. It is conceivable, for instance, that each electrode element may comprise one specific shape feature, such as an indentation or protrusion, that is added to the basic circular shape to contribute a specific component to an electrostatic field, such as a specific component of a multipole field.

For instance, the apertures of the at least two electrode elements may have areas that differ by at least 5%, based on a largest area. Thus, if at least two electrode elements and thus at least two apertures are provided, an aperture of a first electrode element may be at least 5% larger than an aperture of a second electrode element. In those embodiments, the first electrode element would preferably be disposed downstream of the second electrode element. In general, if a plurality of electrode elements are provided spaced apart along the optical axis in an electrostatic lens arrangement, areas of apertures formed by peripheral inner edges thereof may be substantially equal, i.e. substantially constant along the optical axis, or alternatively, may increase or decrease in a downstream direction.

In exemplary embodiments of the particle-optical system according to the present invention, the plurality of columns comprises a first group of columns comprising at least one column, wherein the aperture of the at least one electrode element of the electrostatic arrangement of each column of the first group of columns has a first shape, and further comprises a second group of columns comprising at least one column, wherein the aperture of the at least one electrode element of the electrostatic arrangement of each column of the second group of columns has a second shape that is different from the first shape. In particular, the first shape may be different from the second shape with respect to at least one of a number of indentations, a number of protrusions, a shape of a protrusion, a shape of an indentation, a size of a protrusion, a size of an indentation, a symmetry of the shape, and any combination thereof, as mentioned above.

In those embodiments, preferably each column of the first group of columns is surrounded by a first configuration of neighbouring columns and each column of the second group of columns is surrounded by a second configuration of neighbouring columns, wherein the first configuration is different from the second configuration. The first configuration may differ from the second configuration with respect to at least one of a (total) number of neighbouring columns disposed closest to the column, a distance of a neighbouring closest column, a (total) number of neighbouring columns disposed second closest to the column, a distance of second closest neighbouring columns, a symmetry of the configuration of neighbouring columns, and any combination thereof. The same applies, of course, to any other configurations of neighbouring columns that differ from one another.

An influence exerted by neighbouring columns on an electrostatic field within a certain column will typically depend on the arrangement or configuration of neighbouring columns around said column, in particular the number of neighbouring columns around said column, their distance from said column, the symmetry of the configuration, the number of in particular the nearest, second nearest and, potentially, further order nearest columns, and the like. Therefore, for a given configuration of neighbouring columns around any particular column, an influence exerted by the given configuration may be determined, for instance either experimentally or by calculation or simulation, and a non-circular shape of the electrode element of a particular column adapted and optimized accordingly. Thus, each configuration of columns around said particular column may be associated with a predetermined non-circular shape of the aperture of the at least one electrode element of said particular column. For instance, in an array of columns, the first group of columns may comprise those that are surrounded by neighbouring columns on all sides whereas the second group of columns may comprise those columns that are disposed on an edge of the array and thus generally would not have columns disposed on all of their sides. The columns of the first group may, in such a configuration, be exposed to symmetric external disturbances whereas the columns of the second group would typically be exposed to asymmetric disturbances. The shapes of the apertures in the columns in the different groups of columns may therefore be optimised with regard to this difference in configurations and its effect on extent, location and symmetry of disturbances.

In exemplary embodiments of the particle-optical system according to the present invention, the non-circular shape comprises a shape having one, two or four indentations extending from an ideal circle towards the centre of the aperture, the ideal circle having a radius equal to the second distance (wherein the centre of the ideal circle coincides with the centre of the aperture).

Generally, each column has at least one closest neighbouring column and at least one second closest neighbouring column. In further exemplary embodiments, the shape of the aperture of the electrode element of a respective column, preferably of each column of the plurality of columns, has a number of indentations extending from the ideal circle towards the centre of the aperture, which number is equal to a number of second closest columns around the respective column, with the ideal circle having a centre coinciding with the centre of the aperture and a radius equal to the second distance. In those embodiments where the array of the plurality of columns takes the form of a regular, rectangular grid of columns, for instance, an aperture of a column disposed on a corner of the grid would have one indentation only, in accordance with this exemplary embodiment, whereas apertures in columns disposed on an edge, but not in a corner-position would have two indentations and all apertures of columns surrounded by columns on all sides would have four indentations.

Alternatively or in addition to the above embodiments, the particle-optical multi-beam columns may, in a further exemplary embodiment, be arranged in a rectangular array of N rows 1 to N and M lines 1 to M orthogonal to the rows, wherein a third group of columns is comprised of columns disposed in line 1, rows 2 to N−1, and line M rows 2 to N−1, and in row 1, lines 2 to M−1 and row N, lines 2 to N−1, and wherein the apertures of the at least one electrode element of the electrostatic arrangement of each column of the third group of columns have a same third shape. In addition or as an alternative to this exemplary embodiment, in an array of columns as laid out above, a fourth group of columns may be comprised of columns disposed in line 1, row 1, in line 1, row N, in line M, row 1 and in line M row N, wherein the apertures of the at least one electrode element of the electrostatic arrangement of each column of the fourth group of columns have a same fourth shape. In addition or as an alternative there to, in an array of columns as laid out above, a fifth group of columns may be comprised of columns disposed in lines 2 to M−1 in respective rows 2 to N−1, wherein the apertures of the at least one electrode element of the electrostatic arrangement of each column of the fifth group of columns have a same fifth shape. Thus, apertures of electrode elements in columns on a corner, on a periphery and inside the array of columns will differ with respect to non-circular shapes, for instance with respect to at least one of a number of indentations, a number of protrusions, a shape of a protrusion or indentation, a size of a protrusion or an indentation, a symmetry of the shape and any combination thereof, as described before.

These shapes of the apertures of the embodiments described above are, evidently, based on a simplified evaluation of disturbances from neighbouring columns. The shape of the aperture of the at least one electrode element of each individual column may, of course, be adapted individually to account for a total number of neighbouring columns, their configuration and the like, to compensate for higher order disturbances, i.e. disturbances generated by columns spaced further apart, rather than the disturbances that take only the first and second closest columns and their configuration into account. This may be achieved, for instance, by adding further shape features or may altering a size, position, or shape of at least one of a protrusion and an indentation.

In preferred embodiments of the particle-optical system according to the present invention, at least two columns, preferably all of the columns of the plurality of columns, have electrostatic lens arrangements with an electrode element comprised therein which is disposed in a plane spaced at a predetermined distance from a substrate plane, with said plane preferably being arranged parallel to the substrate plane. Further, in those preferred embodiments, the electrode elements which are comprised in neighbouring columns and which are disposed in said plane may be arranged on a common mounting structure, which mounting structure preferably would be substantially disposed in or at least parallel to said plane, and preferably orthogonal to the optical axes of the neighbouring columns. An individual electrode element or at least a portion thereof, such as an annular inner member, as referred to above, may be inserted into, fixed to, rested on or otherwise held by the mounting structure. For instance, the mounting structure may be an electrode element mounting plate, which mounting plate may comprise openings for the individual electrode elements or portions/members thereof. The electrode elements may be manufactured independently from the mounting structure or be integrally formed with the mounting structure. Use of a mounting structure has an advantage in that it facilitates positioning electrode elements of electrostatic lens arrangement of neighbouring columns to be suitably positioned, in particular positioned such that they all have the same distance from the substrate plane and are thus disposed in the same plane.

In those embodiments of the particle-optical system according to the present invention wherein electrostatic lens arrangements of two or more adjacent columns each comprise two or more electrode elements, in particular a first electrode element and a second electrode element arranged coaxially to the first electrode element and spaced apart in the direction of the optical axis, the first electrode elements of the electrostatic arrangements of adjacent columns may be disposed at a same first distance from the substrate plane and mounted to a first mounting structure and the respective second electrode elements of the electrostatic arrangements of columns may be disposed at a same second distance from the substrate plane and mounted on a second electrode element mounting structure. The first and second mounting structures are then arranged parallel to one another in the plane orthogonal to the optical axis. Likewise, respective third electrode elements may be arranged on a common third mounting structure, and further electrode elements likewise.

In those embodiments, the first and second mounting structures may be spaced apart by electrically insulating spacer elements, which may be disposed at a periphery of the mounting structures or, optionally, at peripheries of the respective first electrode elements.

In particular in those embodiments of the present invention wherein the electrostatic lens arrangement of at least one column comprises two or more electrode elements, the electrode elements may, in addition to an annular inner electrode member, for instance, comprise a substantially cylindrical shielding member, the substantially cylindrical shielding member preferably having a radius equal to or greater than the second distance. The shielding member may be disposed in a gap between electrode elements disposed adjacent to one another along the optical axis so as to further prevent interferences from an outside of the respective column in a space inside the electrostatic lens arrangement. The shielding member may be a cylinder, which is arranged coaxially with the optical axis and extends at least over an axial portion of the gap between respective portions of adjacent electrode elements. Dimensions and location of said portion would be chosen such that no electrical shortcuts are generated in between the adjacent electrode elements. In those embodiments of the present invention wherein first electrode elements are mounted on a first mounting structure and second electrode elements on a second mounting structure, and wherein the electrode elements comprise at least an annular inner electrode member and a shielding member, the inner electrode member may be disposed such as to substantially extend on one side of the mounting structure, as seen in a direction of the optical axis, and the shielding element such as to extend substantially on the other (opposite) side of the mounting structure. For instance, the shielding element may be disposed substantially upstream of the mounting structure and the inner electrode member such that it extends substantially downstream of the mounting structure.

Preferably, in all embodiments of the present invention, the aperture of an electrode element is shaped and arranged such as to provide multi-pole correction for electrostatic fields generated within the electrostatic lens arrangement the electrode element is comprised in.

In exemplary embodiments of the particle-optical system according to the present invention, each beamlet generating arrangement comprises a charged particle source for generating a beam of charged particles and a beam patterning structure downstream of the charged particle source, which comprises the multi-aperture plate, and optionally further components, and which is configured to blank out at least a portion of the charged particle beam such that a pattern of multiple beamlets is formed downstream of the patterning structure.

The charged particle source may be any conventional particle source suitable for use in the present invention. In those embodiments where the charged particles are electrons, the charged particle source would be an electron source, such as an electron source of a thermal field emission (TFE) type. In those embodiments where ions are used as charged particles, an ion gun would be a suitable charged particle source, for instance. Charged particle sources suitable for use in the present invention are well known in the art and include sources employing a tungsten (W) filament, $LaB_6$ sources and various others. The charged particle source may be, for instance, a source of a single beam of charged particles, may be an array of sources of a single charged particle beam each, or a multi-beam source.

In typical embodiments of the particle-optical system according to the present invention, a centre of the at least one aperture of the electrode element of the electrostatic lens arrangement of a first column is disposed at least 50 mm from a centre of the at least one aperture of the electrode element of the electrostatic lens arrangement of a second column, with the second column being arranged closest to the first column in the array of multi-beam charged particle columns. More generally, optical axes of neighbouring columns may be in a range of from about 75 mm to about 100 mm spaced apart.

Moreover, in preferred embodiments, one or more of the plurality of multi-beamlet columns comprises a voltage source for applying a potential to the at least one electrode element of their electrostatic lens arrangements. If the electrostatic lens arrangement comprises more than one electrode element, each electrode element may have a different potential applied thereto. Each column in the column array may have its own one or more voltage supplies, or alternatively, two or more columns in the column array may share one or more voltage supplies. Preferably, the voltage supply is an adjustable voltage supply.

Electrode elements having an aperture having a non-circular shape could be suitably manufactured by casting a electrode element with a circular aperture which is subsequently turned on a special high-precision lathe to create the additional shape features, i.e. finely process the inner peripheral edge in a radial and optionally in an axial direction to create the desired non-circular shape. The special lathe comprises a first and additionally a second tool-feed axis that is superimposed to the first tool-feed axis. The second tool-feed axis may be put into practice by means of piezoelectric translator elements in order to reach the required accuracy. Preferably, the accuracy of manufacturing to be achieved is in a range of about 2 to 10 micrometers.

Those embodiments that comprise two or more mounting structures, the mounting structures may be built as stiff cages having ceramic insulators disposed between them. The mounting structures may be soldered together. The electrode elements may be machined/subjected to further fine processing after having been mounted to the mounting structure to allow for a uniform and more precise machining of all electrode elements mounted in the same plane and to the same mounting structure.

The electrodes may be made from soft magnetic material, for instance, such as soft iron or permalloy. Furthermore, the electrodes may be coated with a suitable coating, such as thin films of well conducting materials. In exemplary embodiments, a thin film, such as a thin film of titanium, gold, platinum, or any other precious metal may be provided. In alternative embodiments, a homogeneous thin film of carbon may also be used. In addition to the thin film, a bonding agent may be used to enhance adhesion of the thin film to the surface of the multi-aperture plate, for example a thin film of bonding agent may be used in between the plate surface and the thin metal film. As an example, Cr, W or Pt, or any suitable combination thereof, may be used as a bonding agent. These exemplary embodiments are advantageous for protecting the electrode surface from contaminations, in particular when a potential is applied, and may assist in decreasing heat and/or charge accumulating on a respective surface or avoiding oxidation thereof.

The present invention, in a second aspect, further pertains to a method of exposing a substrate by multi-beam multi-column exposure, comprising: generating a plurality of multiple beamlet patterns by a respective plurality of multi-beamlet particle-optical columns of the particle-optical system according to the present invention and directing the plurality of multiple beam let patterns towards a substrate to be exposed; generating electrostatic fields by applying electric potentials to the at least one electrode elements of the electrostatic lens arrangements of the plurality of multi-beamlet particle-optical columns, allowing the multiple beamlet patterns to pass through respective apertures of the electrode elements of the electrostatic lens arrangements of the plurality of multi-beamlet particle-optical columns.

Embodiments, features and effects of the method of the present invention generally correspond to or may be derived from the embodiments and effects described above in connection with the system of the present invention.

Embodiments and advantages of components, in particular the electrode elements, the apertures, the mounting structure and so on, are in accordance to the ones described above in connection with the multi-beamlet multi-column particle-optical system.

BRIEF DESCRIPTION OF THE DRAWINGS

The foregoing as well as other advantageous features of the present invention should become more apparent from the following detailed description of exemplary embodiments of the invention with reference to the accompanying drawings.

It is noted that not all possible embodiments of the present invention necessarily exhibit each and every, or any, of the advantages identified herein.

DETAILED DESCRIPTION OF DEPICTED EMBODIMENTS

Figure 1:
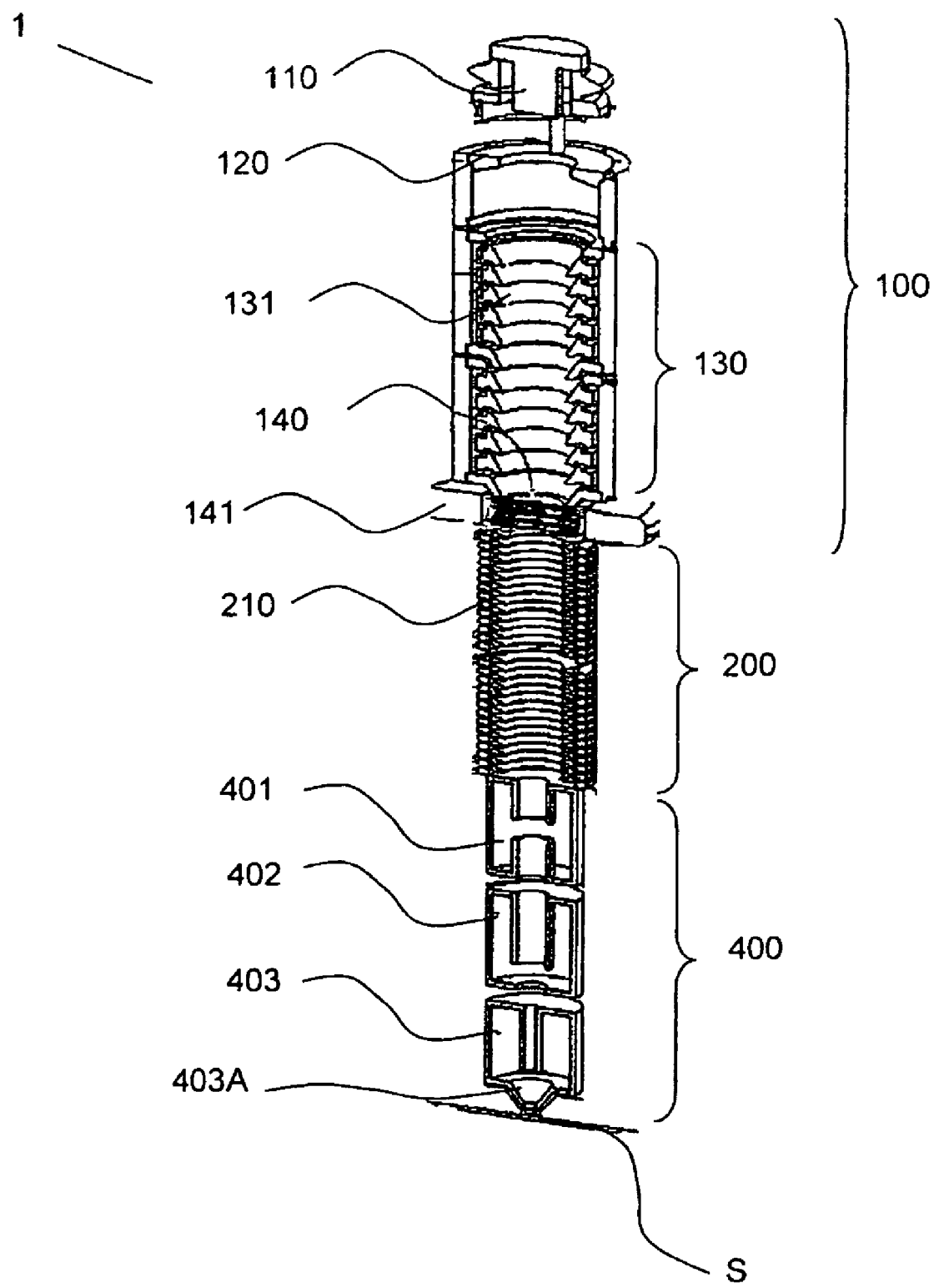
FIG. 1 schematically illustrates an embodiment of one column of a multi-beamlet multi-column particle-optical system according to the present invention, in a cut-open view.

In FIG. 1, particle-optical components of an embodiment of multi-beamlet particle-optical column 1 for use in a multi-column, multi-beamlet particle-optical system according to the present invention are illustrated. In the depicted embodiment, column 1 comprises, in a direction in which the charged particles would generally travel, a beamlet generating arrangement 100, electrostatic lens 200 and electromagnetic focussing lens arrangement 400. Beamlet generating arrangement 100 comprises charged particle source 110, extraction system 120 and condenser lens 130. The condenser lens 130 comprises a stack of electrodes 131. The beamlet generating system further comprises beam-patterning structure 141 held by a mounting frame 141. The beam patterning structure 141 generally comprises a multi-aperture plate, and may be a blanking aperture array, for instance, as described above. The electrostatic lens arrangement 200 comprises a plurality of electrode elements 210 which are arranged in series along the optical axis of the system, i.e. placed in a stack to be traversed by the charged particles. In the depicted embodiment, the distances between adjacent electrode elements are substantially the same. In other embodiments, these differences may vary. Electromagnetic focussing lens arrangement 400 comprises three electromagnetic lenses 401, 402, 403, with electromagnetic lens 403 being disposed closest to a substrate plane S and comprising a conical portion 403A.

Charged particle source 110 generates charged particles, and may be, for instance, an electron gun for generating electrons. Extraction system 120 extracts the generated charged particles, accelerates them to a desired energy level and directs them towards a substrate plane S. Condenser lens 130 directs and forms the charged particles into a substantially telecentric beam of charged particles. The beam of charged particles is then incident on beam patterning structure 140. In case of a blanking aperture array, charged particles pass through the apertures of the blanking aperture arrays that are in a switched on state, thus forming a plurality of beamlets. Details of such a blanking aperture array may be found in US 2003/0155534 A1, as already referred to above.

The electrostatic lens arrangement 200 depicted in FIG. 1 forms an immersion-type lens. For providing a focussing effect, an electrostatic field is generated by applying a suitable electric potential to at least one electrode element of the electrostatic lens arrangement. Together with the electromagnetic focussing lens arrangement 400, the electrostatic lens arrangement 200 forms a projection system of the particle-optical system, which serves to project an image of the patterning structure 140, in the case of a blanking aperture array the switched on apertures, into the substrate plane S to expose a substrate disposed therein with the pattern of the switched on apertures.

Figure 2:
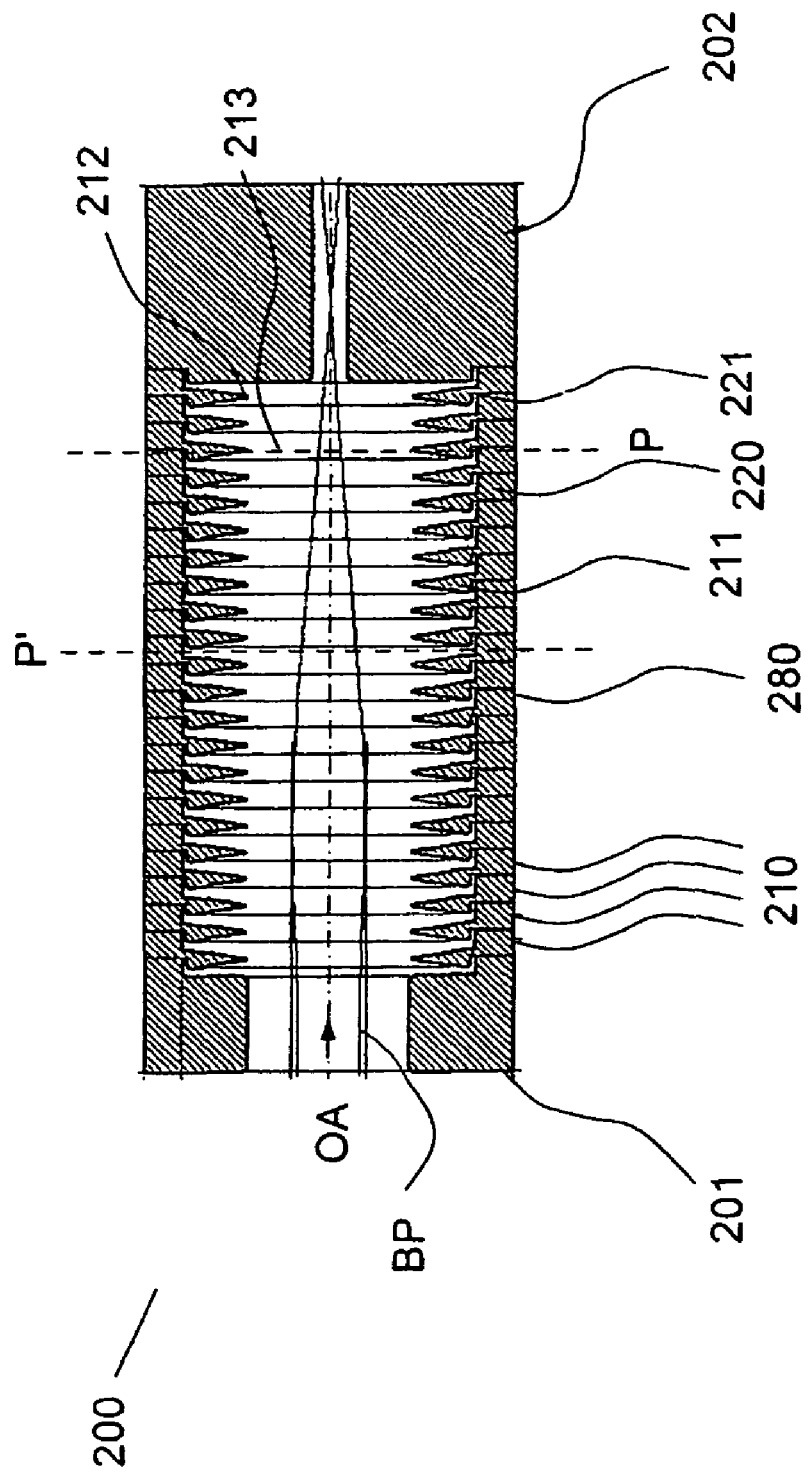
FIG. 2 schematically illustrates an embodiment of an electrostatic lens arrangement for use in a system according to the present invention.

FIG. 2 shows an example of an electrostatic lens arrangement 200. Electrostatic lens arrangement 200 comprises a plurality of electrode elements 210 which are disposed coaxially in a stack along the optical axis OA of the electrostatic lens arrangement 200. The electrostatic lens arrangement 200 further comprises a front element 201 upstream of the stack of electrode elements 210 and an exit element 202 downstream of the stack of electrode elements 210. An aperture formed by the front element 210 is, in the depicted embodiment, substantially of the same size as apertures 213 the electrode elements 210 whereas an aperture formed by back element 202 is substantially smaller. The reduced size is feasible since the charged particles traversing the electrostatic lens arrangement 200 are focussed by same such that a diameter of a beam path BP entering the electrostatic lens arrangement 200 at a front end is larger than a diameter of the beam path exiting from the electrostatic lens arrangement 200 through exit element 202, as indicated by the outline of the beam path in FIG. 2. It is to be noted that the beam path encompasses the beamlet paths of the multiple beamlets generated by the beam patterning structure upstream of the electrostatic lens arrangement 200, but is illustrated as a an envelope of the beamlet paths for ease of illustration. Front element 210 and exit element 202 serve to define and control an initial and a final electrostatic potential for the charged particles entering and exiting from the electrostatic lens arrangement 200.

Adjacent electrode elements 210 are separated by spacer elements 280. Each electrode element 210 comprises an outer ring portion 220, an inner electrode member 211 and a connecting element 221 for connecting the outer ring portions 220 and the inner electrode member 221. Inner electrode members, in the depicted embodiment, have a wedge-like shape with a thicker portion at an outer peripheral end and a thinner portion at an inner peripheral end. Electrode element 210, in particular inner electrode member 211, has an inner peripheral edge 212 that defines an aperture 213 through the electrode element 210 and thus the inner electrode member 211, in a plane P orthogonal to the optical axis OA. In the depicted embodiment, the non-circular shape of the apertures 213 formed is not visible. The provision of the spacer elements 280 allows to apply an individual electrostatic potential to each electrode element 210 independently of other potentials applied to other electrode elements. The electrical connections for applying potentials are not depicted in FIG. 2.

Electrostatic potentials may be supplied by one or more voltage supplies (power sources), or a resistor array interpolating the individual electrostatic potentials from a small number of potentials supplied, for instance.

The electrode elements 210 depicted in FIG. 2 have substantially the same configuration; in particular the depicted electrode elements have apertures 213 that do not substantially vary in size. In other embodiments, however, sizes (in particular in terms of areas within plane P) of apertures 213 of subsequent electrode elements may vary, for instance decrease in a downstream direction. This would be the case, for instance if a distance of the inner peripheral edge of each electrode element 210 was to have about a same distance from an outer periphery of the envelope of the multiple beamlets of charged particles, a diameter of which decreases in a downstream direction.

In other embodiments, reference numeral 220 could be replaced by reference numeral 212 to indicate a shape of the inner peripheral edge in a plane P' different from, but parallel to plane P, i.e. a plane at a different axial position, for instance upstream of plane P. The inner peripheral edge 212 would then form an aperture having a circular shape in the plane P' and alter in the axial direction to form an aperture 213 having a noncircular shape in plane P. Preferably, and in accordance with the depicted embodiment, the aperture 213 in plane P has a smaller area than the aperture formed in plane P'.

Figure 3:
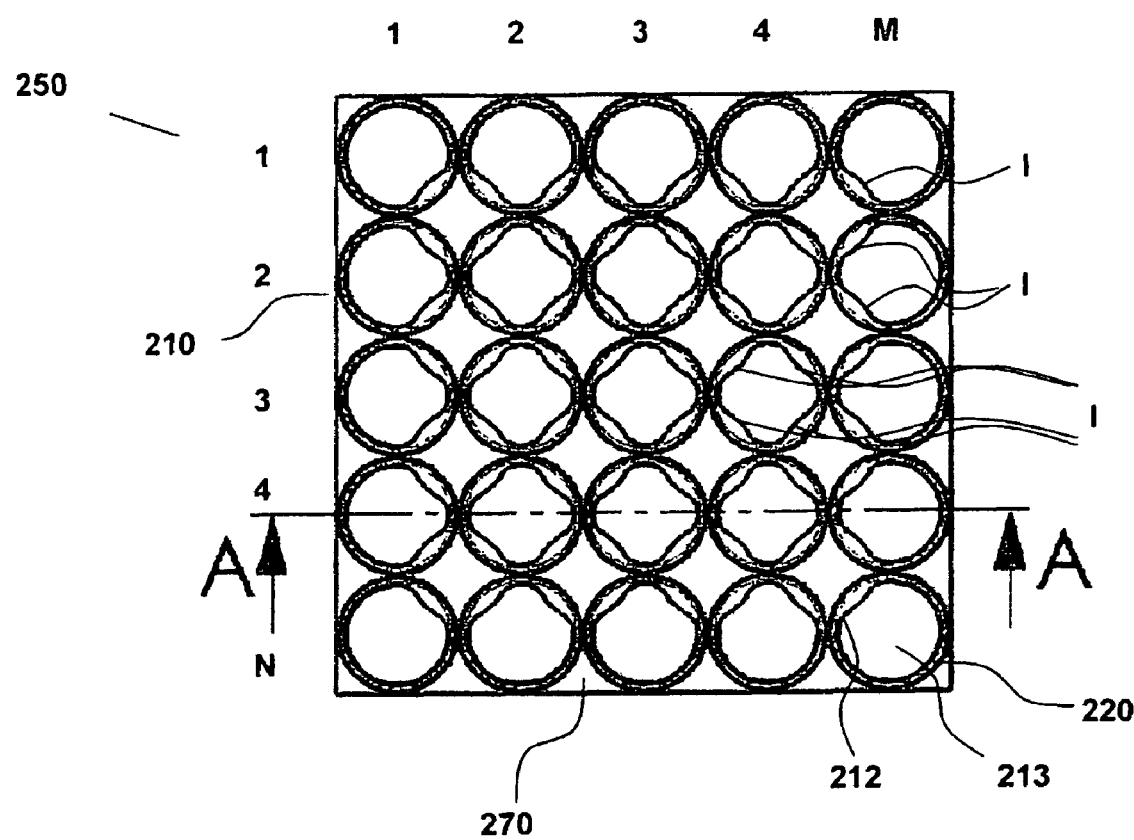
FIG. 3 schematically illustrates an elevational view (in a direction of the optical axes) onto an embodiment of an array of respective first electrode elements of electrostatic lens arrangements of neighboring columns, said first electrode elements being mounted on a common first mounting plate.

In FIG. 3, an array 250 of 5×5 electrode elements 210 is depicted, with the individual electrode elements 210 being held by a common mounting plate 270. Each individual electrode element 210 is part of an individual column of the plurality of columns, which are, in correspondence to their electrode elements, arranged in the 5×5 array. The array of electrode elements 210 is a regular rectangular array having rows 1 to N, in this case rows 1 to 5 and lines 1 to M, herein lines 1 to 5. As described before, each electrode element 210 has an aperture 213 having a noncircular shape. Each aperture 213 is formed by inner peripheral edge 212 of electrode element 210. Inner edges of cylindrical outer members 220 are also visible in FIG. 3. In the depicted embodiment the non-circular shapes comprise at least one indentation I from an ideal circular shape. The shapes of the apertures 213 are dependent on a position of the respective electrode element 210 within the array 250. The apertures 213 of electrode elements 210 of a first group of columns) disposed in positions (row, line) (1,1), (N, 1), (1, M) and (N, M) have a shape with one indentation I each, the respective indentation I facing away from a respective corner of the array. The apertures 213 of electrode elements 210 of a second group of columns disposed in positions (row, line) (2-4, 1), (1, 2-4), (2-4, M) and (N, 2-4) have substantially the same non-circular shape (excluding the orientation thereof) having two indentations I from an ideal circular shape each. The apertures 213 of electrode elements 210 of a third group of columns disposed in positions (row, line) (2-4, 2-4) have substantially a same shape with four indentations I from an ideal circular shape. The difference between the apertures of the respective groups is the number of nearest and second nearest neighbours and the symmetry of the configuration of neighbouring columns. The apertures of the first group of columns are disposed on corners of the array and have two nearest and one second nearest neighbour. Electrostatic fields generated by such an environment may be compensated for by the provision of one indentation oriented in a direction of the second nearest neighbouring column. The columns disposed on edges of the array, but not on corners have neighbouring columns in three directions with three nearest and two second nearest neighbouring columns each. Electrostatic fields generated by such an environment may be suitably compensated four by providing the respective apertures 213 with a non-circular shape having two indentations I from an ideal circular shape, with the indentations I being oriented in directions of the second nearest neighbouring columns.

Figure 4:
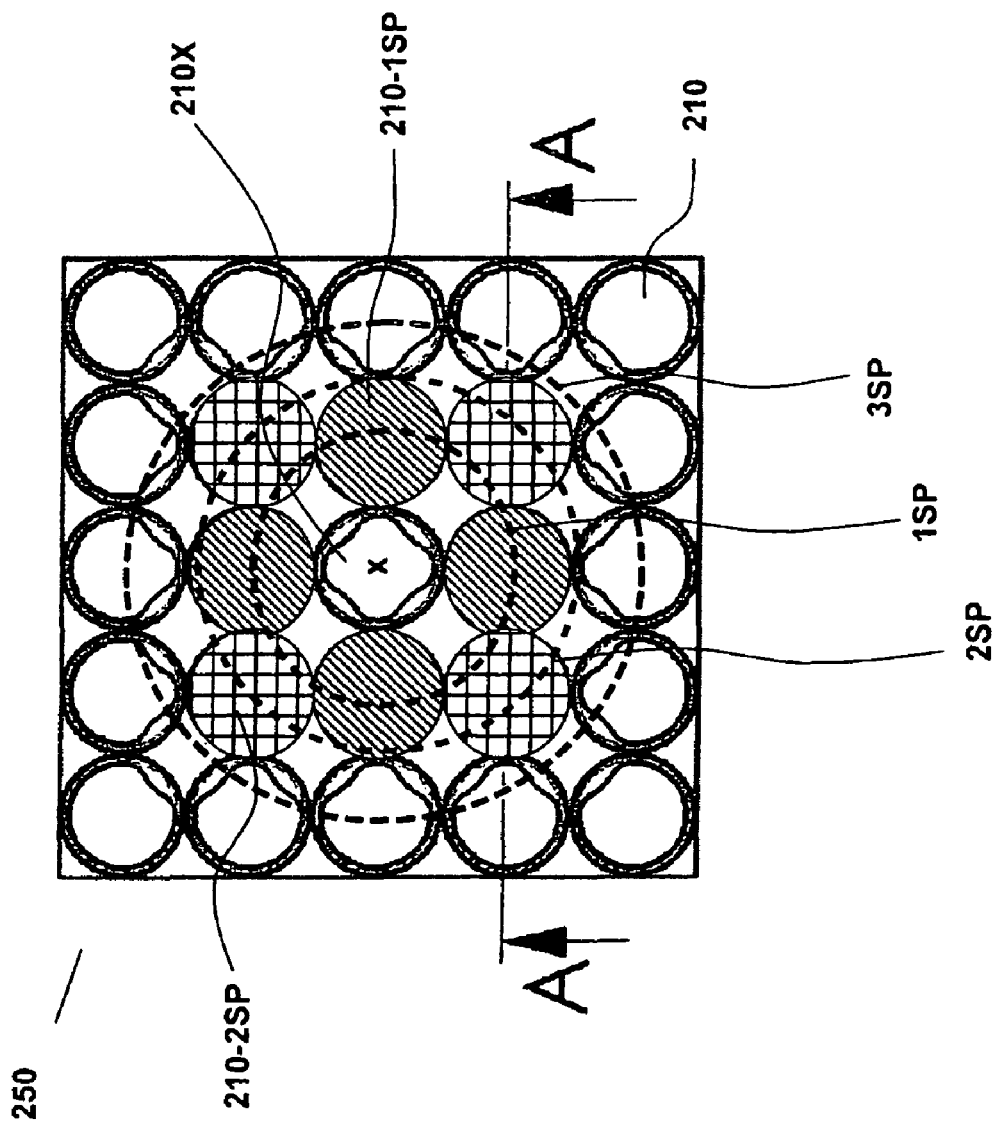
FIG. 4 schematically illustrates an embodiment of a configuration of apertures of neighboring lenses around the aperture shown in FIG. 5.

A column of the third group is disposed inside the array, i.e. is surrounded by neighbouring columns in all four directions. As further illustrated in FIG. 4, an electrode element 210X inside a regular, rectangular array 250 is surrounded by a first sphere 1SP of nearest neighbouring columns, the first sphere being marked by a dashed line running through centres of the four nearest electrode elements 210-1SP around electrode element 210X, which are indicated by a hatch pattern. Electrode elements 210-2SP disposed second nearest to electrode element 210X are indicated by a square pattern, the second sphere 2SP being further indicated by dotted line 2SP running through centres of the second nearest electrode elements 210-2SP. A third sphere is further indicated by dashed line 3SP. Further spheres could be marked in FIG. 6, with each further sphere running through centres of respective electrode elements disposed on a predetermined radius from the centre of the aperture 210X, but are not indicated for sake of simplicity. As apparent from FIG. 4, the arrangement of columns around column 210X is highly symmetric and has fourfold symmetry. Therefore, a shape of the aperture 213 of the electrode element 210 (210X) of the third group has four indentations I from an ideal spherical shape, the indentations being oriented in a direction of the second nearest neighbours (210-2SP). This shape of aperture is advantageously multi-pole corrected to compensate for electrostatic fields generated by the symmetrical layout of neighbouring columns as indicated in FIGS. 3 and 4. The description of shapes, as given above, represents a simplified approach. Evidently, in other embodiments, further shape features may be superimposed to the shapes as described above, to take an influence of columns disposed at a greater distance also into account.

Figure 5:
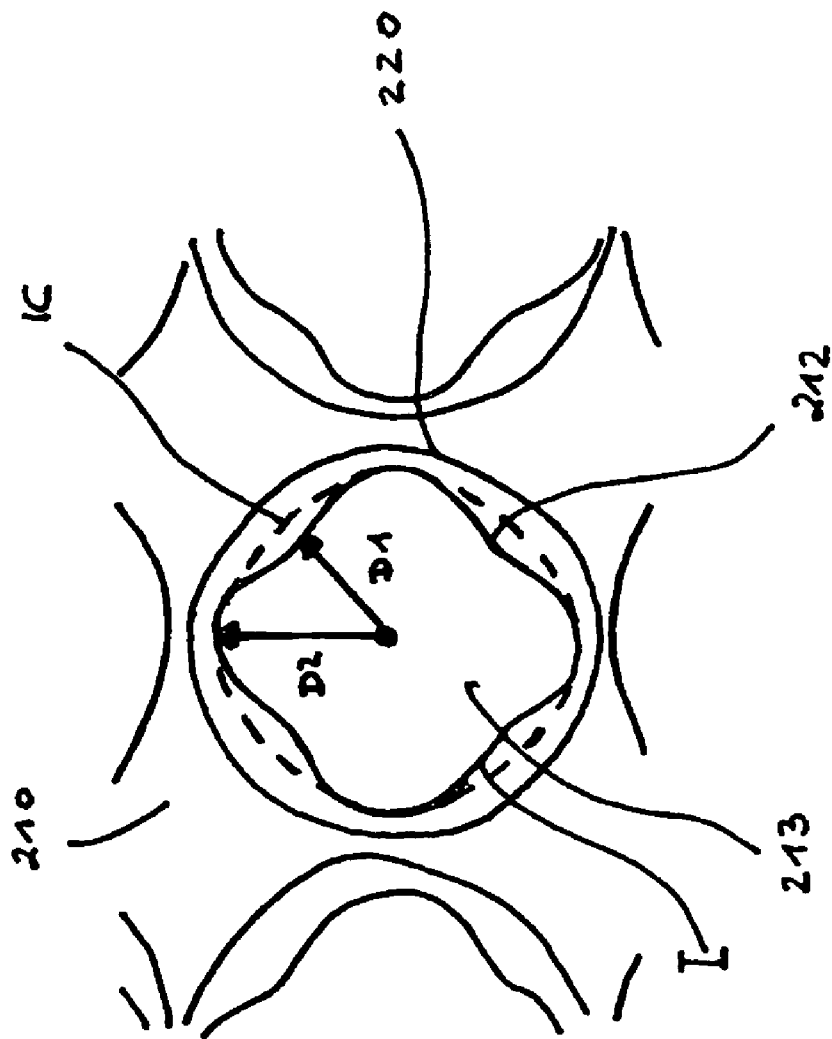
FIG. 5 schematically illustrates an embodiment of a non-circular shape of an aperture of an electrode element comprised in an electrostatic lens arrangement according to the present invention.

In FIG. 5, the characteristics used herein to describe the shape of the non-circular aperture 213 are illustrated. The aperture 213 is an aperture 213 of an electrode element 210 of a column of the third group of columns, as described above. The non-circular shape, in particular a deviation of the shape of the aperture 213 from an ideal circle is characterised herein by a difference between a distance D1 from the centre of the aperture 213, which typically coincides with the optical axis, and a point on the inner peripheral edge 212 forming the aperture 213, which point is disclosed closest to the optical axis, i.e. is a shortest distance of any point on the inner peripheral edge 212 from the centre of the aperture 213. The centre of the aperture is marked by a black dot. A second distance D2 is defined as the distance of a point on the inner peripheral edge 212 that is disposed farthest from the centre of the aperture 213. Thus, generally, the point defining the first distance would be disposed on an indentation I. The indentation I is a shape feature describing a portion of the aperture, which deviates from an ideal spherical shape and extends towards the centre of the aperture 213. An ideal spherical shape IC may be defined to be a circle with a centre coinciding with the centre of the aperture and having a radius equal to the second distance D2. This definition was chosen for sake of simplicity. As will be readily apparent to the skilled person, other definitions may have been chosen to describe a non-circular shape. Inner peripheral edge of outer ring member 220 is also depicted, with the same considerations as given in connection with FIG. 3 applying.

Figure 6:
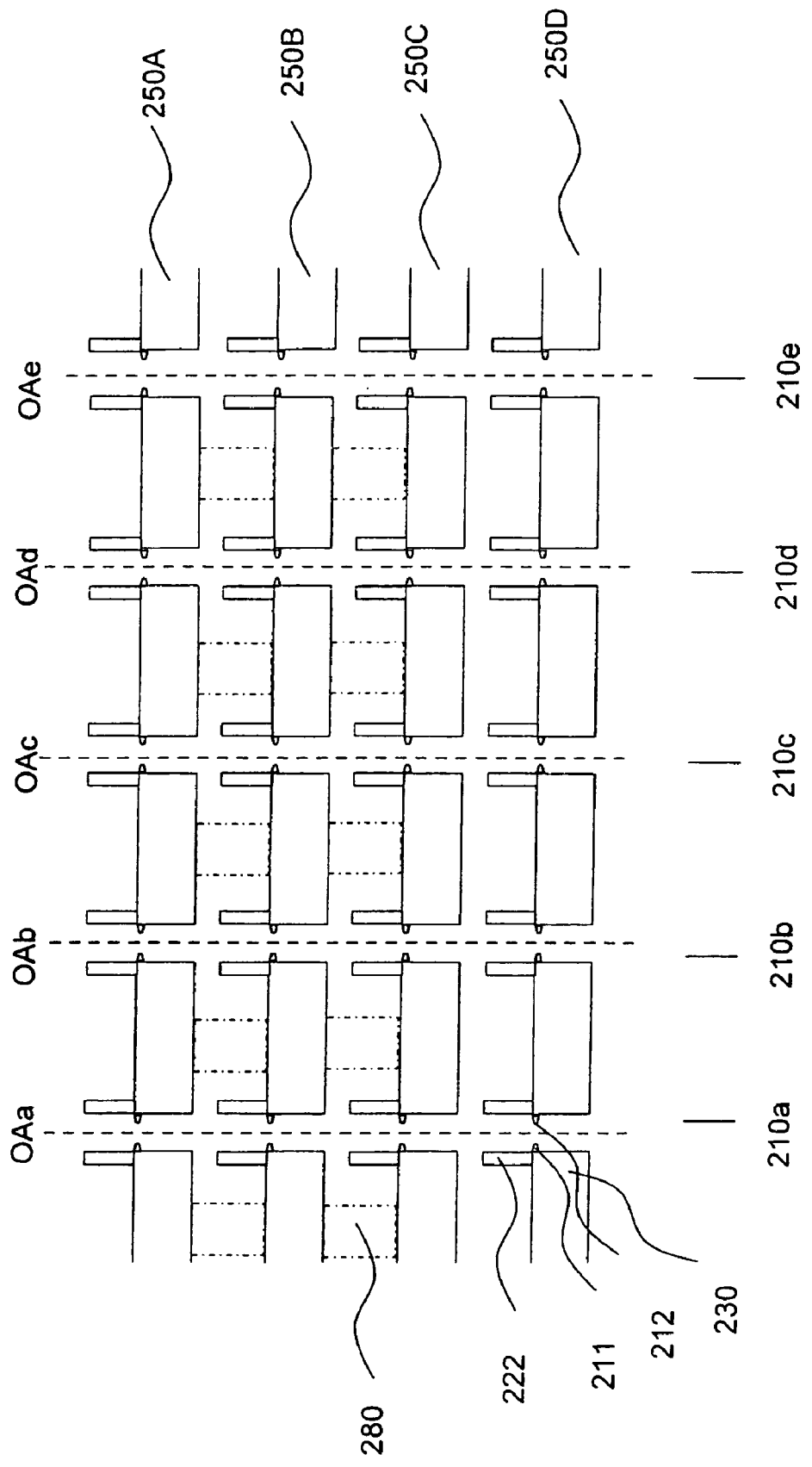
FIG. 6 schematically illustrates a cut along line A-A through the embodiment of the array of electrode elements as depicted in FIG. 3.

In FIG. 6, a cut through array 250 along line A . . . A as illustrated in FIGS. 3 and 4 is depicted. Array 250 is one of a plurality of arrays 250A through 250D which are arranged in series along the optical axes OA (a through e) of the individual columns a through e and parallel to one another in a plane orthogonal to the optical axes OAa through OAe. Each column a, b, c, d, e has an electrostatic lens arrangement with a plurality of electrode elements 210a, 210b, 210c, 210d, 210e, respectively, disposed coaxially one after another in a stack along a respective optical axis OAa, OAb, OAc, OAd, OAe of the column a, b, c, d, e. Each electrode element 210 a through e comprises an inner electrode member 211 around the respective optical axis OA. Each electrode element 210 a through e further comprises a shielding member 222 of cylindrical shape disposed in a region of an outer periphery of inner electrode member 211 and on plate 230. Shielding member is disposed in a gap between two adjacent arrays 250A/, B/C, C/D, D/E in order to prevent electrostatic fields from penetrating inside the respective electrostatic lens formed by respective electrode elements. Plate 230 may be a mounting structure in the form of a plate comprising apertures for accommodating inner electrode members. For instance, inner electrode member 211 and shielding member 222 may be attached to plate 230 independently, with the inner electrode member 211 being inserted into a respective aperture of the mounting plate whereas cylindrical shielding member is disposed around a circumference of the respective aperture. In alternative embodiments, plate 230 may be a portion of the electrode element 210 comprising outer ring portion 220 as well as connector 221 as depicted in FIG. 2, with respective portions 230 of neighbouring electrode elements 210 a through e (in the same plane orthogonal to the optical axis) being connected to one another. The electrode elements 210 and plate 230 may be integrally formed, for instance. FIG. 6 illustrates the coaxial alignment of the electrode members 211 (a through e, respectively) disposed in series along the optical axis and configuration of electrode elements 210 of neighbouring columns on a common mounting structure. A few insulating spacer elements 280 arranged between mounting plates 250A/B and B/C to space them apart are also illustrated as an example. Of course, spacer elements could also be disposed between the other mounting structures (not depicted for ease of illustration). In addition, fewer spacer elements could be used in between two given mounting plates, or they could be disposed in different positions relative to the apertures and the like, as will be readily apparent to the skilled person.

While the invention has been described also with respect to certain specific embodiments thereof, it is evident that many alternatives, modifications and variations will be apparent to those skilled in the art. Accordingly, the preferred embodiments of the invention set forth herein are intended to be illustrative and not limiting in any way. Various changes may be made without departing from the spirit and scope of the present invention as defined in the following claims.

What is claimed is:

1. A multi-beamlet multi-column particle-optical system comprising a plurality of particle-optical multi-beamlet columns, the plurality of particle-optical multi-beamlet columns being disposed in an array for simultaneously exposing a same substrate;

with each particle optical column having an optical axis and comprising:

a beamlet generating arrangement comprising at least one multi-aperture plate having a plurality of apertures for generating a pattern of multiple beamlets of charged particles, and an electrostatic lens arrangement downstream of the beamlet generating arrangement, the electrostatic lens arrangement comprising at least one electrode element, the at least one electrode element having an aperture allowing the generated multiple beamlets of charged particles to pass through, the aperture being defined by an inner peripheral edge facing the optical axis, the aperture having a centre and a predetermined shape in a plane orthogonal to the optical axis;

wherein in at least one of the plurality of charged particle columns, the predetermined shape of the aperture of the at least one electrode element is a non-circular shape with at least one of a protrusion and an indentation from an ideal circle about the centre of the aperture, and wherein a first distance between a point on the inner peripheral edge of the aperture disposed closest to the centre of the aperture is at least about 5% smaller than a second distance between a point on the inner peripheral edge of the aperture disposed furthest away from the centre of the aperture.

2. The particle-optical system according to claim 1, wherein the electrode element comprises an annular inner electrode member having an inner peripheral edge and wherein the aperture is formed by the inner peripheral edge.

3. The particle-optical system according to claim 1, wherein the electrostatic lens arrangement of the at least one of the plurality of charged particle multi-beamlet columns comprises two or more electrode elements which are disposed coaxially and spaced apart in the direction of the optical axis.

4. The particle-optical system according to claim 3, wherein the apertures of the at least two electrode elements have substantially the same non-circular shape.

5. The particle-optical system according to claim 4, wherein the aperture of a first electrode element of the at least two electrode elements has an area that is by at least 5% larger than an area of the aperture of a second electrode element of the at least two electrode elements.

6. The particle-optical system according to claim 1, the plurality of columns comprising a first group of columns comprising at least one column, wherein the aperture of the at least one electrode element of the electrostatic arrangement of each column of the first group of columns has a first shape, and further comprising a second group of columns comprising at least one column, wherein the aperture of the at least one electrode element of the electrostatic arrangement of each column of the second group of columns has a second shape that is different from the first shape.

7. The particle-optical system according to claim 6, wherein
the first shape is different from the second shape with respect to at least one of a number of indentations, a number of protrusions, a shape of a protrusion, a shape of an indentation, a size of a protrusion, a size of an indentation, a symmetry of the shape and any combination thereof.

8. The particle-optical system according to claim 6, wherein
each column of the first group of columns is surrounded by a first configuration of neighbouring columns and each column of the second group of columns is surrounded by a second configuration of neighbouring columns, and wherein the first configuration is different from the second configuration.

9. The particle-optical system according to claim 8, wherein the first configuration differs from the second configuration with respect to at least one of a number of neighbouring columns disposed closest to the respective column, a number of neighbouring columns disposed second closest to the respective column, a symmetry of the configuration of neighbouring columns and any combination thereof.

10. The particle-optical system according to claim 1, wherein the non-circular shape comprises a shape having one, two or four indentations extending from an ideal circle towards the centre of the aperture, the ideal circle having a radius equal to the second distance.

11. The particle-optical system according to claim 1, wherein each column has at least one closest neighbouring column and at least one second closest neighbouring column, and wherein a number of indentations in the shape of the aperture of the at least one electrode element of at least one column is equal to a number of second closest columns around the at least one column, with the indentations extending from the ideal circle towards the centre of the aperture, the ideal circle having a radius equal to the second distance.

12. The particle-optical system according to claim 1, wherein the particle-optical multi-beam columns are arranged in a rectangular array of N rows 1 to N and M lines 1 to M orthogonal to the rows,
wherein a third group of columns is comprised of columns disposed in line 1, rows 2 to N−1, and line M rows 2 to N−1, and in row 1, lines 2 to M−1 and row N, lines 2 to N−1, and wherein the apertures of the at least one electrode element of the electrostatic arrangement of each column of the third group of columns have a same third shape.

13. The particle-optical system according to claim 1, wherein the particle-optical multi-beam columns are arranged in a rectangular array of N rows 1 to N and M lines 1 to M orthogonal to the rows,
wherein a fourth group of columns is comprised of columns disposed in line 1, row 1, in line 1, row N, in line M, row 1 and in line M row N,
and wherein the apertures of the at least one electrode element of the electrostatic arrangement of each column of the fourth group of columns have a same fourth shape.

14. The particle-optical system according to claim 1, wherein the particle-optical multi-beam columns are arranged in a rectangular array of N rows 1 to N and M lines 1 to M orthogonal to the rows,
wherein a fifth group of columns is comprised of columns disposed in lines 2 to M−1 in respective rows 2 to N−1,
and wherein the apertures of the at least one electrode element of the electrostatic arrangement of each column of the fifth group of columns have a same fifth shape.

15. The particle-optical system according to claim 1, wherein the at least one electrode elements of the electrostatic arrangements of neighbouring columns have a same distance from a substrate plane and are arranged on a mounting structure extending substantially in a plane orthogonal to the optical axes of the neighbouring columns.

16. The particle-optical system according to claim 1, further comprising a first and a second mounting structure,
wherein the optical axes of columns disposed adjacent to one another are arranged in parallel,
wherein each of the adjacent columns comprises two or more electrode elements with a first electrode element and at least a second electrode element being arranged coaxially and spaced apart in the direction of the optical axis of the column,
wherein the first electrode elements of the adjacent columns have a same first distance from a substrate plane and are arranged on the first mounting structure,
wherein the second electrode elements of the adjacent columns have a same second distance from the substrate plane and are arranged on the second mounting structure, the first and second mounting structures being arranged parallel to one another in a plane orthogonal to the optical axes of the columns.

17. The particle-optical system according to claim 16, wherein the first and second mounting structures are spaced apart by electrically insulating spacer elements.

18. The particle-optical system according to claim 3, wherein the electrode elements further comprise a substantially cylindrical shielding member, the substantially cylindrical shielding member having a radius equal to or greater than the second distance.

19. The particle-optical system according to claim 1, wherein the aperture is shaped and arranged such as to provide multi-pole correction for electrostatic fields generated within the electrode arrangement.

20. The particle-optical system according to claim 1, wherein each beamlet generating arrangement comprises a charged particle source for generating a beam of charged particles, and a beam patterning structure downstream of the charged particle source, the beam patterning structure comprising at least the multi-aperture plate and being configured to blank out at least a portion of the charged particle beam such that a pattern of multiple beamlets is formed downstream of the patterning structure.

21. The particle-optical system according to claim 1, wherein the centre of the at least one aperture of the electrode element of the electrostatic lens arrangement of a first column is disposed at least 50 mm from the centre of the at least one aperture of the electrode element of the electrostatic lens arrangement of a second column, with the second column being arranged closest to the first column in the array of multi-beam charged particle columns.

22. The particle-optical system according to claim 1, wherein the shape of the aperture is asymmetric with respect to the optical axis of the respective multi-beam particle-optical column.

23. The particle-optical system according to claim 1, wherein the centre of the aperture is disposed on the optical axis of the respective multi-beamlet particle-optical column.

24. A method of exposing a substrate by multi-beam multi-column exposure, comprising:
generating a plurality of multiple beamlet patterns by a respective plurality of multi-beamlet particle-optical columns of the particle-optical system according to claim 1 and directing the plurality of multiple beam let patterns towards a substrate to be exposed;
generating electrostatic fields by applying electric potentials to the at least one electrode elements of the electrostatic lens arrangements of the plurality of multi-beamlet particle-optical columns,
transmitting the multiple beamlet patterns through respective apertures of the electrode elements of the electrostatic lens arrangements of the plurality of multi-beamlet particle-optical columns.

* * * * *